(12) United States Patent
Hu et al.

(10) Patent No.: US 6,382,896 B1
(45) Date of Patent: May 7, 2002

(54) FRONT-OPENING UNIFIED POD CLOSING/OPENING CONTROL STRUCTURE

(75) Inventors: Ping-Yu Hu, Hsinchu Hsien; Kuan-Chou Chen, Hsinchu; Tzong-Ming Wu, Taipei; Wu-Lang Lin, Hsinchu Hsien, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 09/705,728

(22) Filed: Nov. 6, 2000

(30) Foreign Application Priority Data

Sep. 8, 2000 (TW) ........................................ 89215577 U

(51) Int. Cl.⁷ .............................................. B65G 49/07
(52) U.S. Cl. ..................... 414/217; 414/217.1; 414/937; 414/939
(58) Field of Search ............................ 414/217, 217.1, 414/937, 939

(56) References Cited

U.S. PATENT DOCUMENTS 6,082,951 A * 7/2000 Nering et al. ............ 414/217.1
6,281,516 B1 * 8/2001 Bacchi et al. .......... 250/559.29

* cited by examiner

Primary Examiner—Steven A. Bratlie
(74) Attorney, Agent, or Firm—Rabin & Berdo, P.C.

(57) ABSTRACT

A front-opening unified pod closing/opening control structure includes a transmission motor controlled to rotate a transmission shaft, causing the transmission shaft to rotate two worm gear sets through two worms, each worm gear set including a worm gear meshed with one worm, a radially extended locating plate fixedly fastened to the worm gear, and a gasket member having a rectangular center hole, two actuating bolts respectively fitted into the rectangular center hole and secured to the worm gear sets by a respective nut, keeping the locating plates of the worm gear sets maintained at right angles, two first stop pins adapted to stop the locating plates of the worm gear sets in a first position where the actuating bolts close the cover of the FOUP, and two second stop pins adapted to stop the locating plates of the worm gear sets in a second position where the actuating bolts open the cover of the FOUP.

20 Claims, 6 Drawing Sheets

FRONT-OPENING UNIFIED POD CLOSING/OPENING CONTROL STRUCTURE

BACKGROUND OF THE INVENTION

1. Field of the Invention

The present invention relates to a closing/opening mechanism and, more specifically, to a FOUP (front-opening unified pod) closing/opening control structure.

2. Brief Description of the Prior Art

A regular SMIF (Standard Mechanical Inteface) load-port uses a linkage system to close/open the cover of a front-opening unified pod. However, a linkage system for this purpose is complicated. In order to meet the requirement of 0°±1° to 90°±1° of SEMI regulation (Semiductor Equipment and Materials International), a specially calibrator must be used during installation. Therefore, much time and labor are wasted in calibration and installation.

Therefore, it is desirable to provide an improved method to mitigate and/or obviate the aforementioned problems.

SUMMARY OF THE INVENTION

The invention has been accomplished under the circumstances in view. It is the main object of the present invention to provide front-opening unified pod closing/opening control structure, which can easily be installed with less installation time and labor without the use of any additional calibrator. To achieve this and other objects of the present invention, there is provided a front-opening unified pod closing/opening control structure controlled to close/open the cover of a front-opening unified pod, comprising: a transmission mechanism, the transmission mechanism comprising a main transmission shaft, a motor controlled to rotate the main transmission shaft, two worms respectively mounted on two distal ends of the main transmission shaft, and fixing means that fasten the worms to the main transmission shaft for enabling the worms to be rotated with the main transmission shaft; two worm gear sets respectively coupled to the transmission mechanism, the worm gear sets each comprising a worm gear meshed with one worm of the transmission mechanism, a locating plate fastened to the worm gear, and a gasket member fixedly connected between the worm gear and the locating plate, the gasket member comprising a transverse groove, which receives the locating plate, and an axially extended center hole; and two actuating bolt and nut sets respectively coupled to the worm gear sets and turned with the worm gear sets to close/open the cover of the front-opening unified pod, the actuating bolt and nut sets each comprising an actuating bolt and a nut, the actuating bolt comprising a hook, a threaded tip screwed up with the nut of the respective actuating bolt and nut set, and an actuating portion axially connected between the hook and threaded tip and fitted into the center hole of the gasket member of the corresponding worm gear set. The locating plate of one worm gear set is disposed in a given angle, for example, parallel to the hook of the actuating bolt of the corresponding actuating bolt and nut set. The locating plate of the other worm gear set is disposed perpendicular to the mentioned first locating plate the hook of the corresponding actuating bolt and nut set. Further, two first stop pins and two second stop pins are provided to limit the turning angle of the locating plates of the worm gear sets. The first stop pins are adapted to stop the locating plates of the worm gear sets at right angles, keeping the hooks of the actuating bolt and nut sets retained in parallel in a first position. The second stop pins are adapted to stop the locating plates of the worm gear sets at right angles, keeping the hooks of said actuating bolt and nut sets retained in parallel in a second position. The motor can be a step motor, a servomotor, a DC motor, or any of a variety of equivalent driving members. The axially extended center hole of the gasket member of each worm gear set can have a square, rectangular, triangular or polygonal shape, or any of a variety of non-circular shapes. The locating plate of each worm gear set can be fastened to the transverse groove of the corresponding gasket member by adhesion, welding, screw means, or any equivalent fixing means.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
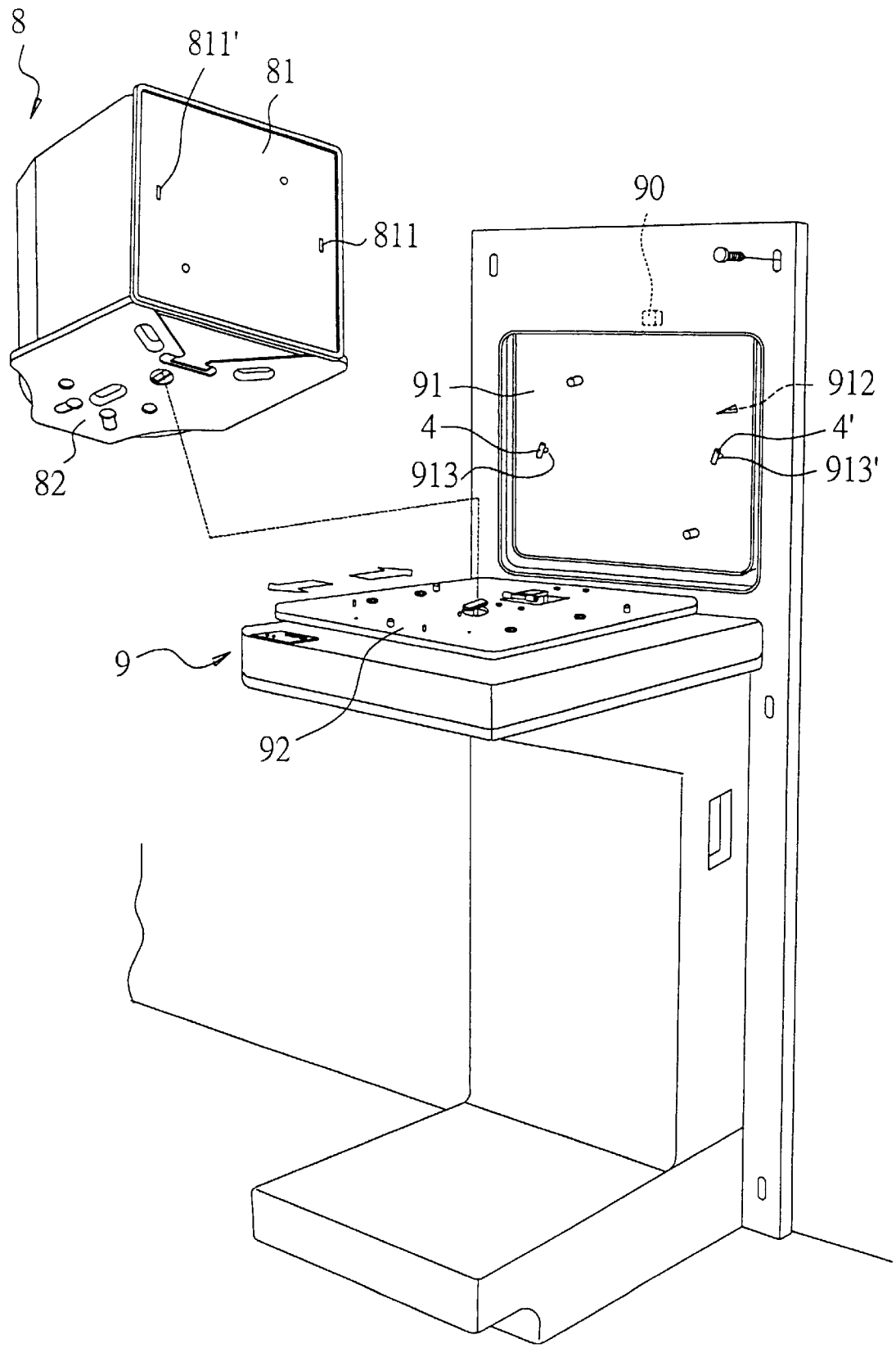
FIG. 1 is a perspective view of a SMIF load-port.

Referring to FIG. 1, a SMIF load-port 9 is shown adapted to load a FOUP 8. The SMIF load-port 9 comprises a door 91. The door 91 has two through holes 913 and 913' disposed near two lateral sides corresponding to the two mounting holes 811 and 811' on the cover 81 of the FOUP 8. The bottom 82 of the FOUP 8 is fixedly clamped to a carriage 92, which is moved back and forth in front of the door 91 for enabling the cover 81 of the FOUP 8 to be contact to the door 91. The front-opening unified pod closing/opening control structure of the present invention is installed in the back sidewall 912 of the door 91, and controlled to open/close the cover 81 of the FOUP 8.

Figure 4:
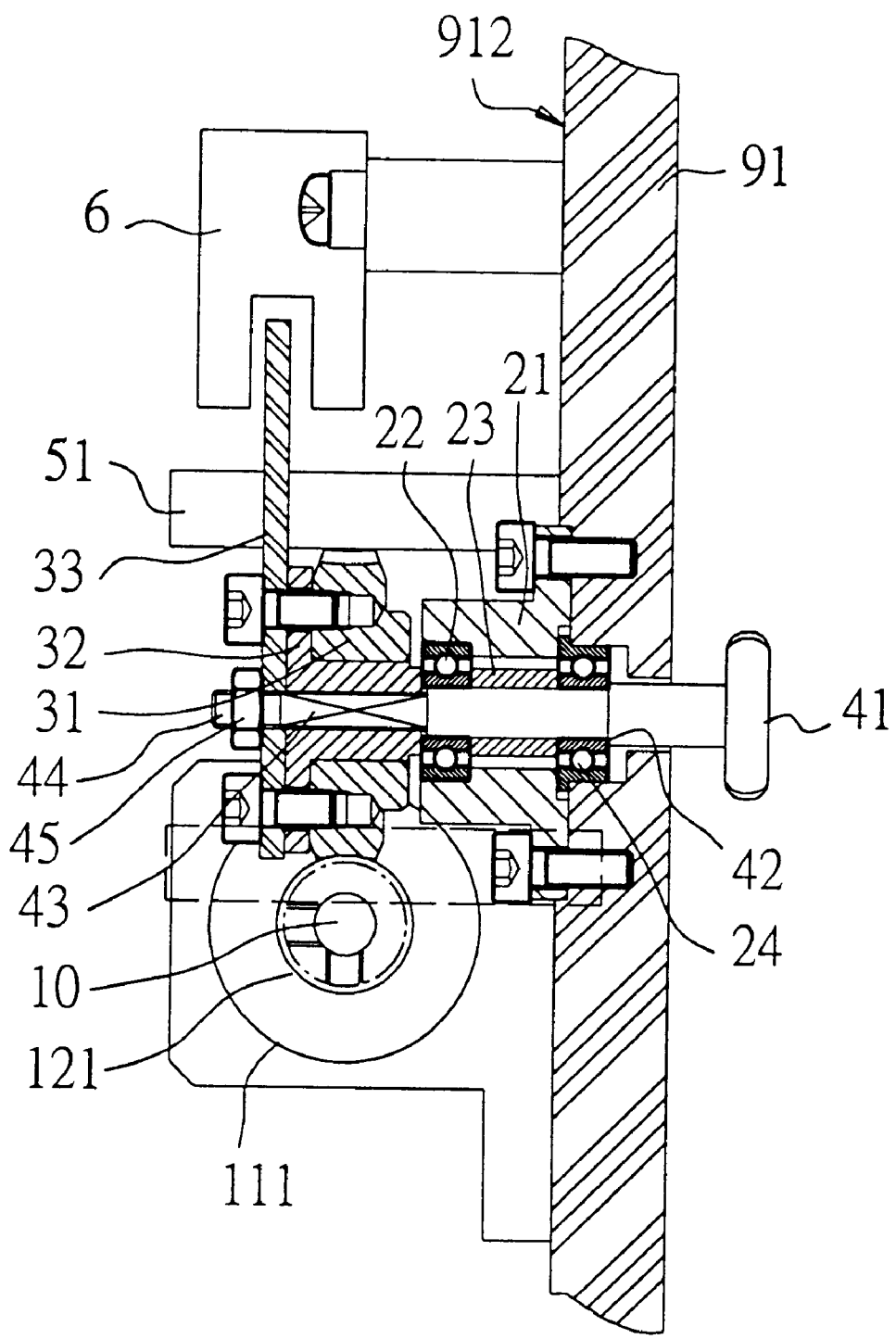
FIG. 4 is a sectional view of the front-opening unified pod closing/opening control structure according to the present invention.

Referring to FIGS. from 2 through 4 and FIG. 1 again, the front-opening unified pod closing/opening control structure comprises a transmission mechanism 1, two worm gear sets 3 and 3', and two actuating bolts 4 and 4'. The transmission mechanism 1 comprises a step motor 14, a transmission shaft 10 supported on axle bearings 111 and 112, a belt wheel 101 fixedly mounted on the transmission shaft 10, a transmission belt 15 coupled between the step motor 14 and the belt wheel 101 for enabling the transmission shaft 10 to be rotated by the step motor 14, and two worms 121 and 122 respectively fastened to two distal ends of the transmission shaft 10 by lock screws 131 and 132. Two axle bearing sets 2 and 2' are respectively mounted on the back sidewall 912 of the door 91 in alignment with the through holes 913 and 913' axially. Each axle bearing set 2 or 2' comprises a bearing block 21 or 21', two axle bearings 22 and 24 mounted in the bearing block 21 or 21', and a spacer ring 23 retained between the axle bearings 22 and 24 (see FIG. 4). The worm gear sets 3 and 3' each comprise a worm gear 31 or 31', a gasket member 32 or 32', and a locating plate 33 or 33'. The worm gear 31 or 31', the gasket member 32 or 32' and the locating plate 33 or 33' are fixedly fastened together by screws, keeping the gasket member 32 or 32' retained between the worm gear 31 or 31' and the locating plate 33 or 33'. The worm gears 31 and 31' are preferably molded from plastics, preventing contamination during friction between the worm gears 31 and 31' and the worms 121 and 122. The gasket member 32 or 32' has a transverse groove 321 or 321', which receives the corresponding locating plate 33 or 33', and an axially extended rectangular center hole 322 or 322', which receives the rectangular actuating portion 43 or 43' of the corresponding actuating bolt 4 or 4'. The actuating bolt 4 or 4' each comprises a T-shaped hook 41 or 41' of a bolt body which is inserted through one through hole 913 or 913' of the door 91 and one axle bearing set 2 or 2' and the rectangular center hole 322 or 322' of the gasket member 32 or 32' of one worm gear set 3 or 3', a threaded tip 44, and a rectangular actuating portion 43 or 43' axially connected between the T-shaped hook 41 or 41' and fitted into the rectangular center hole 322 or 322' of the gasket member 32 or 32'. The bolt body has a shoulder 42 or 42'. Two lock nuts 45 and 45' are respectively threaded onto the threaded tips 44 and 44' of the actuating bolts 4 and 4' to force the worm gear sets 3 and 3' against the axle bearing sets 2 and 2'. When fastening up the lock nuts 45 and 45', the shoulder 42 or 42' of the actuating bolt 4 or 4' is stopped at one axle bearing 24 of the corresponding axle bearing set 2 or 2', keeping the respective T-shaped hook 41 or 41' protruded over the front sidewall of the door 91, and then the worm gear 31 or 31' is maintained meshed with the worm 121 or 122, and then the locating plate 33 of one worm gear set 3 is kept in parallel to the T-shaped hook 41 of the corresponding actuating bolt 4 and the locating plate 33' of the other worm gear set 3' is kept perpendicular to the T-shaped hook 41' of the corresponding actuating bolt 4'.

Referring to FIGS. 2 and 3 again, first stop pins 51 and 51' and second stop pins 52 and 52' are respectively provided at the back sidewall 912 of the door 91 to stop the locating plates 33 and 33' of the worm gear sets 3 and 3' between a first position where the cover 81 is closed, and a second position where the cover 81 is opened.

Figure 2:
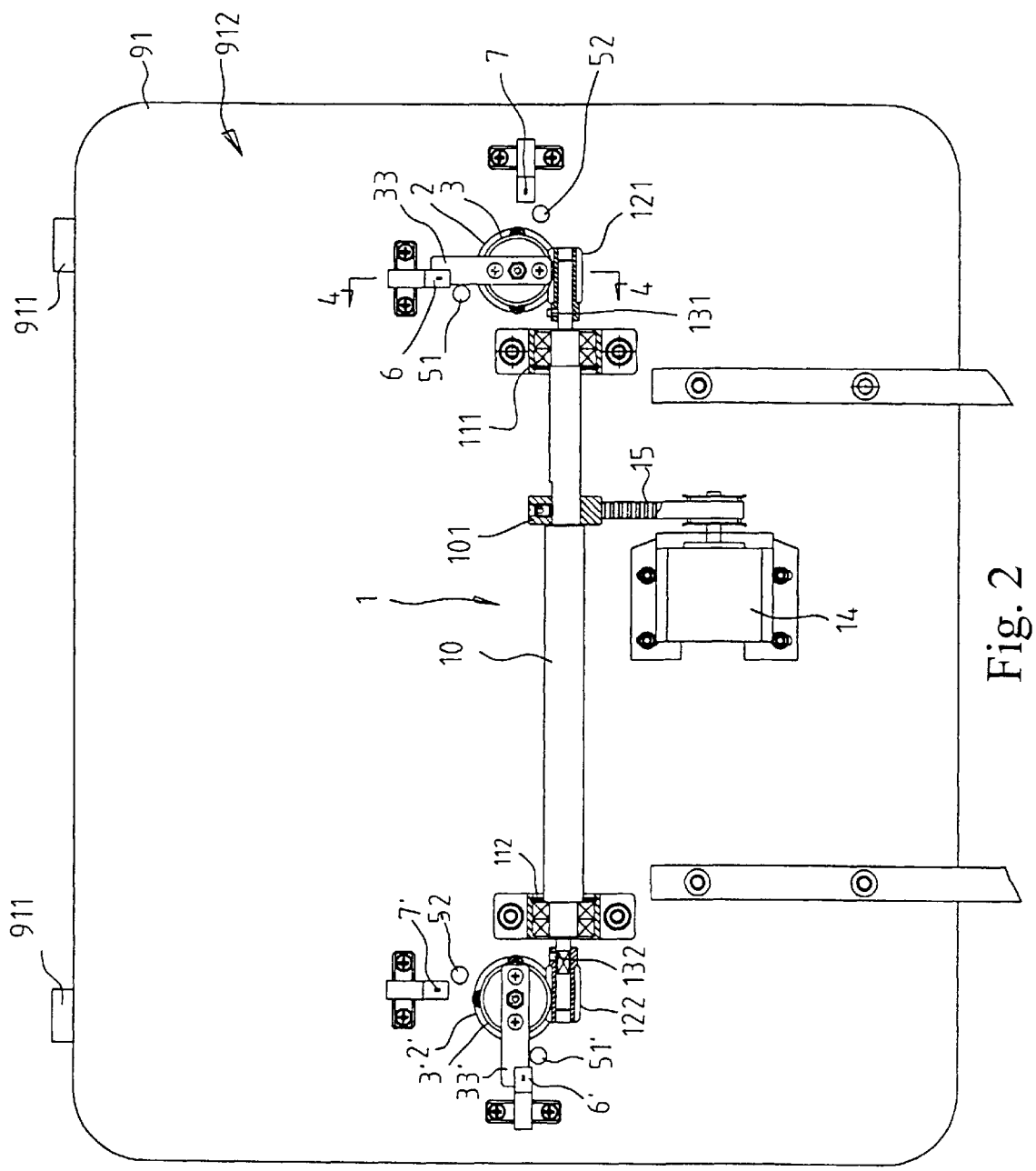
FIG. 2 is a front view showing the front-opening unified pod closing/opening control structure installed in the back sidewall of the door of the SMIF load-port according to the present invention.
Figure 3:
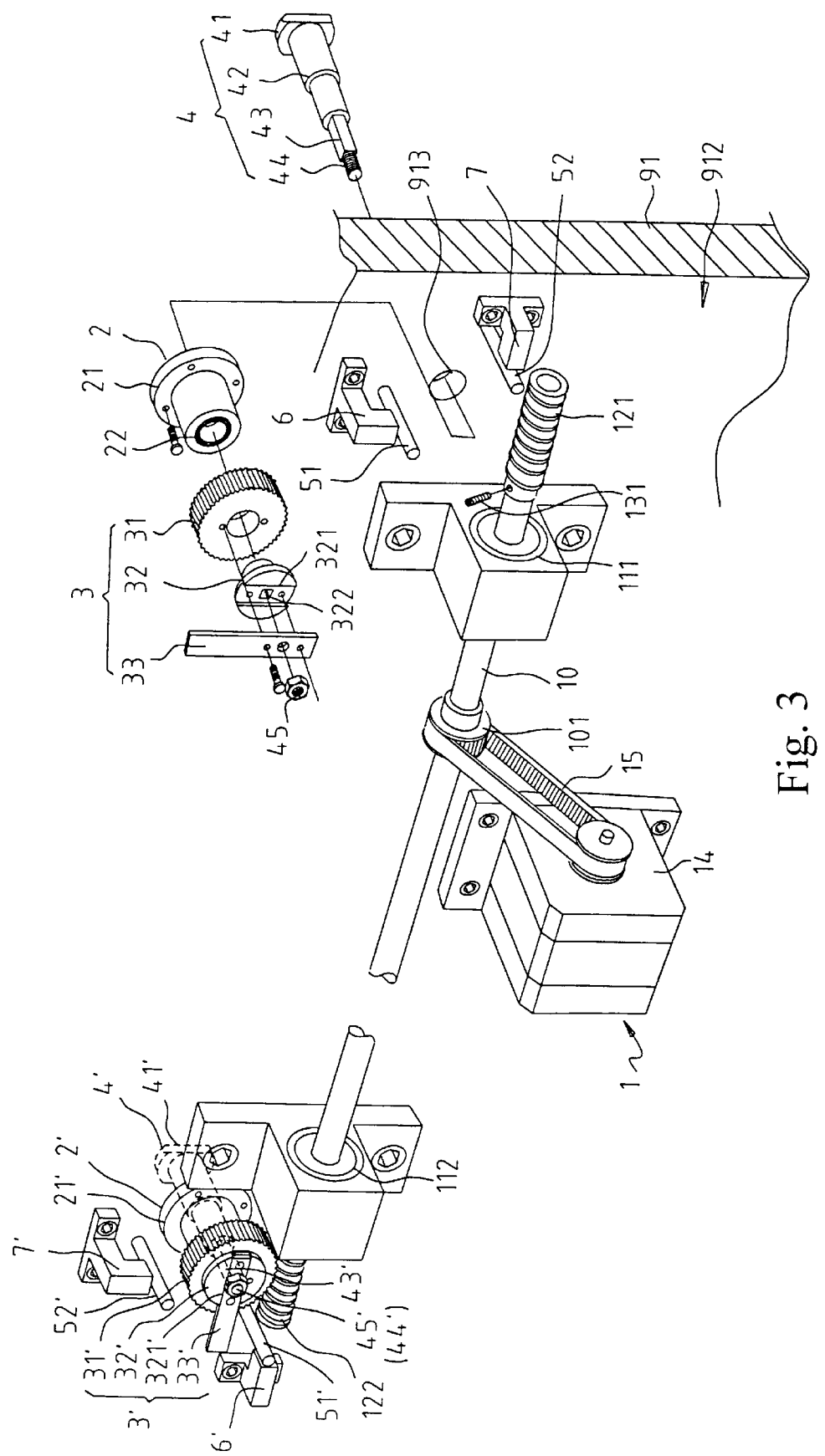
FIG. 3 is an exploded view of the front-opening unified pod closing/opening control structure according to the present invention.

During installation, the screws 131 and 132 are loosened, and the worm gears 31 and 31' are respectively rotated with the respective worms 121 and 122 to turn the locating plates 33 and 33' of the worm gear sets 3 and 3' to the initial point to contact at the first stop pins 51 and 51', namely, the first position. At this time, sensors 6 and 6' start to work, and the locating plates 33 and 33' are maintained at right angles (see FIG. 2). When set into position, the screws 131 and 132 are fastened tight, keeping the locating plates 33 and 33' always maintained at right angles, and the hooks 41 and 41' of actuating bolts 4 and 4' always maintained in parallel. Any rotation occurred in the worm gears 31 or 31' or the transmission shaft 10, the locating plates 33 and 33' can still be maintained at right angles while the hooks 41 and 41' are in parallel. In an alternative way, the locating plates 33 and 33' can be arranged as in parallel while the hooks 41 and 41' are in parallel. In the same way, the locating plates 33 and 33' can be turned to contact the second stop pins 52 and 52', and then locking the screws 131 and 132 while in the second position. The contained angle between the stop pins 51 and 52 or the stop pins 51' and 52' can be precisely set at 90°, enabling the actuating bolts 4 and 4' to be rotated within 0°±1° to 90°±1° matched the SEMI regulation without using any other calibration means. Further, the first stop pins 51 and 52 and the second stop pins 51' and 52' limit the rotation of the locating plates 33 and 33', preventing the actuating bolts 4 and 4' from damaging the mounting holes 811 and 811' of the cover 81 of the FOUP 8 due to a motor brake failure. The first sensors 6 and 6' and the second sensors 7 and 7' shown in FIG. 2 are respectively provided to detect the presence of the locating plates 33 and 33' in the first position and the second position, and to control the operation of the step motor 14 subject to the detection, preventing an erroneous action of the step motor 14. Further, two wafer detectors 911 are provided at the topside of the door 91 (see FIG. 2). When the cover 81 of the FOUP 8 is opened and the door 91 is moved up and down, the wafer detectors 911 detect the amount and positioning of the wafers stored in the FOUP 8. A sensor 90 is installed in the back panel of the SMIF load-port 9 (FIG. 1) to detect protrusion of wafers out of the FOUP 8, preventing damage to wafers upon closing of the cover 81.

Figure 5:
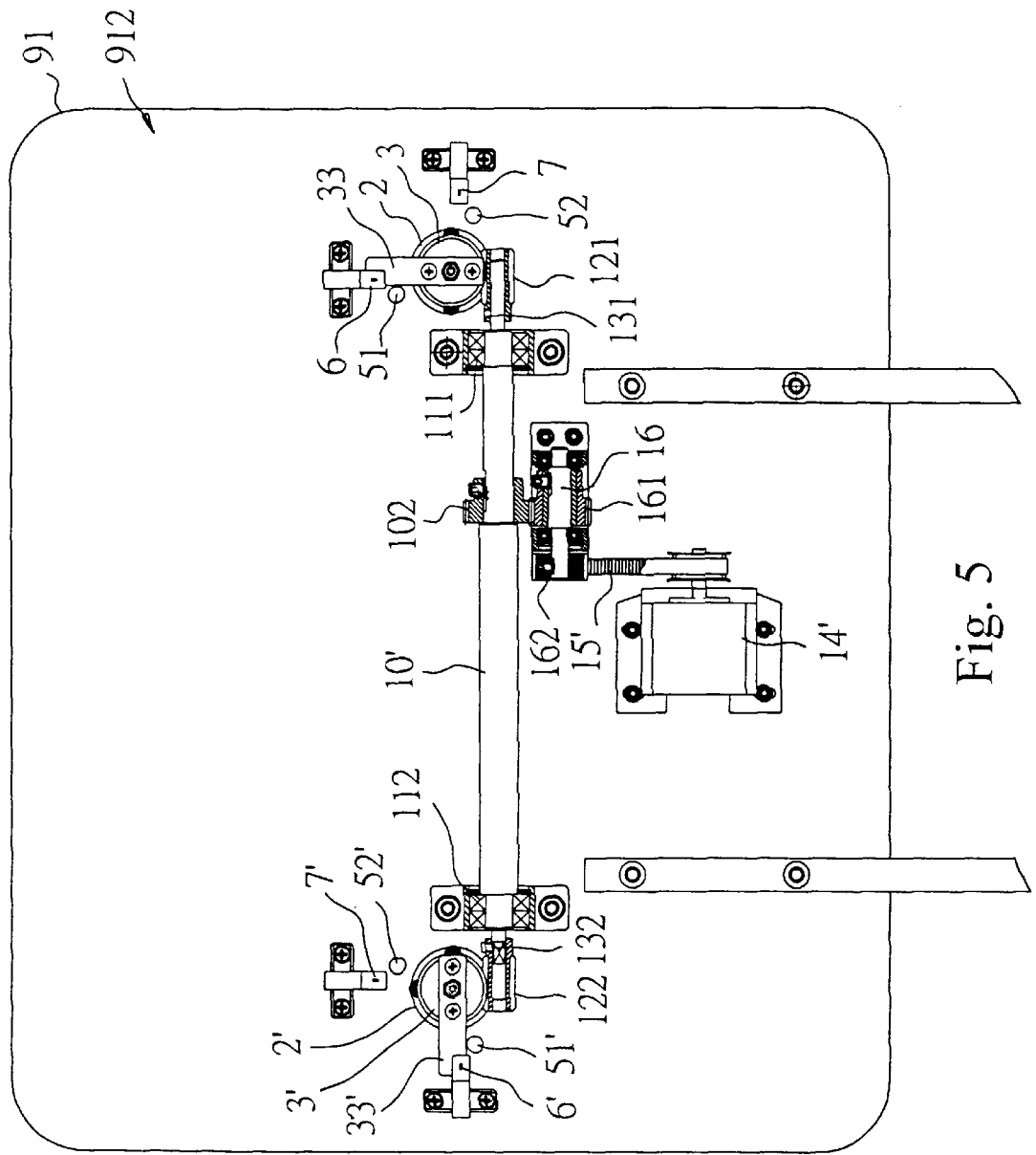
FIG. 5 is a front view showing an alternate form of the front-opening unified pod closing/opening control structure installed in the back sidewall of the door of the SMIF load-port according to the present invention.

FIG. 5 shows an alternate form of the transmission mechanism. According to this alternate form, the transmission mechanism comprises a servo motor 14', a main transmission shaft 10' supported on axle bearings 111 and 112, a driven gear 102 fixedly mounted on the transmission shaft 10', an auxiliary transmission shaft 16, a driving gear 161 fixedly mounted on the auxiliary transmission shaft 16 and meshed with the driven gear 102, a belt wheel 162 fixedly mounted on the auxiliary transmission shaft 16, and a transmission belt 15' coupled between the servo-motor 14' and the belt wheel 162 for enabling the auxiliary transmission shaft 16 to be rotated by the servo motor 14', and two worms 121 and 122 respectively fastened to two distal ends of the transmission shaft 10' by screws 131 and 132.

Figure 6:
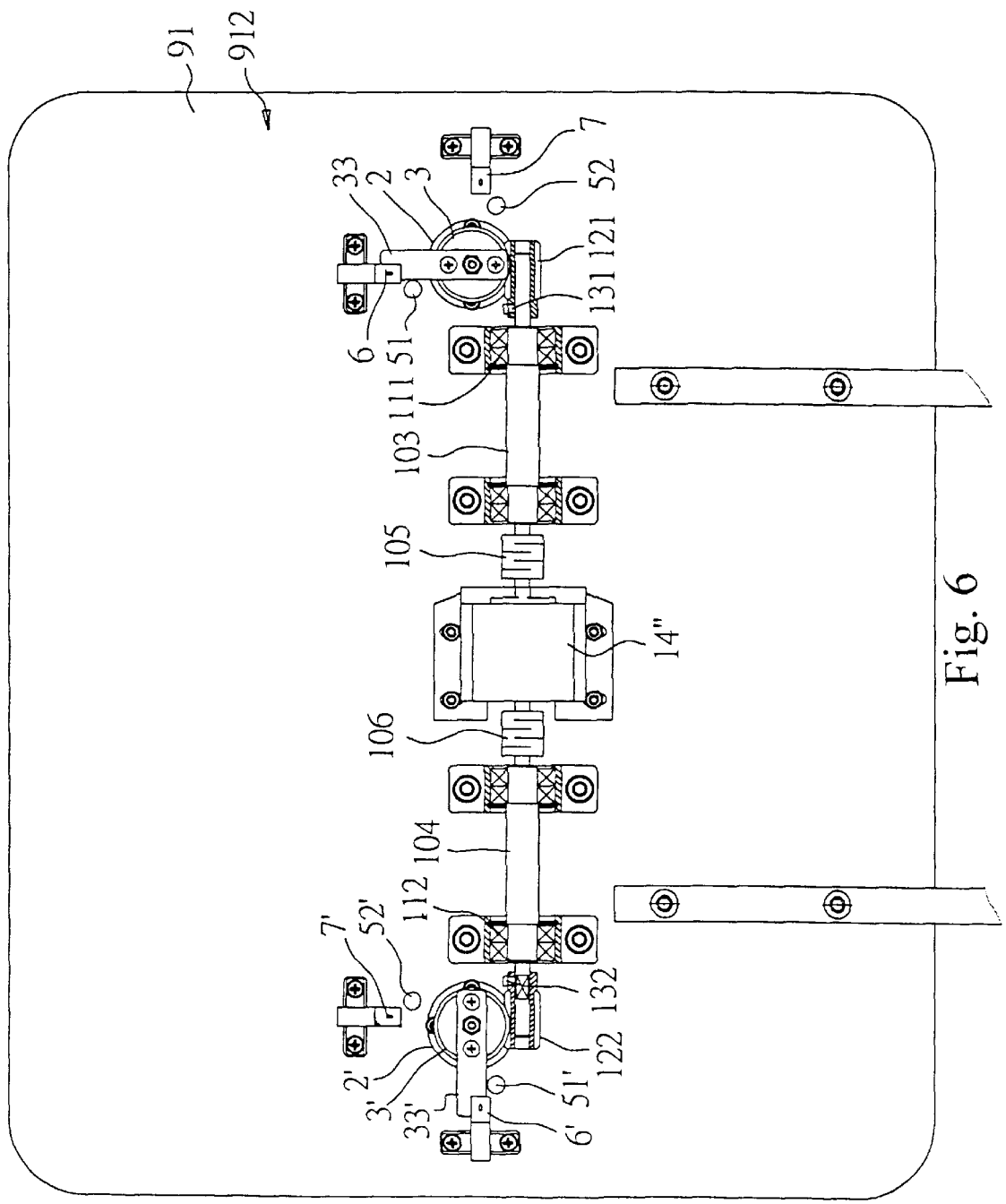
FIG. 6 is a front view showing another alternate form of the front-opening unified pod closing/opening control structure installed in the back sidewall of the door of the SMIF load-port according to the present invention.

FIG. 6 shows another alternate form of the transmission mechanism. According to this alternate form, the transmission mechanism comprises a bi-axial DC motor 14", a first transmission shaft 103 and a second transmission shaft 104 supported on respective axle bearings 111 and 112, two worms 121 and 122 respectively fastened to the first transmission shaft 103 and the second transmission shaft 104 by screws 131 and 132, and two couplings 105 and 106 respectively coupled between the transmission shafts 103 and 104 and the bi-axial DC motor 14".

It is to be understood that the drawings are designed for purposes of illustration only, and are not intended for use as a definition of the limits and scope of the invention disclosed.

What is claimed is:

1. A front-opening unified pod closing/opening control structure controlled to close/open the cover of a FOUP (front-opening unified pod), comprising:

a transmission mechanism, said transmission mechanism comprising a main transmission shaft, a motor controlled to rotate said main transmission shaft, two worms respectively mounted on two distal ends of said main transmission shaft, and fixing means that fasten said worms to said main transmission shaft for enabling said worms to be rotated with said main transmission shaft;

two worm gear sets respectively coupled to said transmission mechanism, said worm gear sets each comprising a worm gear meshed with one worm of said transmission mechanism, a locating plate fastened to said worm gear, and a gasket member fixedly connected between said worm gear and said locating plate, said gasket member comprising a transverse groove, which receives said locating plate, and an axially extended center hole; and two actuating bolt and nut sets respectively coupled to said worm gear sets and turned with said worm gear sets to close/open the cover of said FOUP, said actuating bolt and nut sets each comprising an actuating bolt and a nut, said actuating bolt comprising hook, a threaded tip screwed up with the nut of said respective actuating bolt and nut set, and an actuating portion axially connected between said hook and threaded tip and fitted into the center hole of said gasket member of the corresponding worm gear set.

2. The front-opening unified pod closing/opening control structure as claimed in claim 1 wherein the locating plate of one of said worm gear sets is disposed in parallel to the hook of the actuating bolt of the corresponding actuating bolt and nut set, and the locating plate of the other of said worm gear sets is disposed perpendicular to the hook of the actuating bolt of the corresponding actuating bolt and nut set.

3. The front-opening unified pod closing/opening control structure as claimed in claim 1 further comprising two first stop pins adapted to stop the locating plates of said worm gear sets at right angles, keeping the hooks of said actuating bolt and nut sets retained in parallel in a first position, and two second stop pins adapted to stop the locating plates of said worm gear sets at right angles, keeping the hooks of said actuating bolt and nut sets retained in parallel in a second position.

4. The front-opening unified pod closing/opening control structure as claimed in claim 3 wherein the cover of said FOUP is closed by the hooks of said actuating bolt and nut sets when the locating plates of said worm gear sets are respectively stopped at said first stop pins and the hooks of said actuating bolt and nut sets are turned to said first position.

5. The front-opening unified pod closing/opening control structure as claimed in claim 3 wherein the cover of said FOUP is opened by the hooks of said actuating bolt and nut sets when the locating plates of said worm gear sets are respectively stopped at said second stop pins and the hooks of said actuating bolt and nut sets are turned to said second position.

6. The front-opening unified pod closing/opening control structure as claimed in claim 1 wherein the fixing means that fasten said worms to said main transmission shaft are lock screws.

7. The front-opening unified pod closing/opening control structure as claimed in claim 1 wherein said transmission mechanism further comprises a belt wheel fixedly mounted on said main transmission shaft, and a transmission belt coupled between said motor and said belt wheel for enabling said motor to rotate said main transmission shaft.

8. The front-opening unified pod closing/opening control structure as claimed in claim 1 wherein said transmission mechanism further comprises a driven gear fixedly mounted on said main transmission shaft, an auxiliary transmission shaft, a driving gear fixedly mounted on said auxiliary transmission shaft and meshed with said driven gear, a belt wheel fixedly mounted on said auxiliary transmission shaft, and a transmission belt coupled between said motor and said belt wheel for enabling said motor to rotate said main transmission shaft.

9. The front-opening unified pod closing/opening control structure as claimed in claim 1 wherein said motor is a bi-axial motor, and said main transmission shaft is comprised of a first transmission shaft and a second transmission shaft respectively coupled to two opposite ends of said bi-axial motor by coupling means.

10. The front-opening unified pod closing/opening control structure as claimed in claim 1 wherein said motor is a step motor.

11. The front-opening unified pod closing/opening control structure as claimed in claim 1 wherein said motor is a servomotor.

12. The front-opening unified pod closing/opening control structure as claimed in claim 1 wherein said motor is a DC motor.

13. The front-opening unified pod closing/opening control structure as claimed in claim 1 further comprising two axle bearing sets adapted to support said worm gear sets and the actuating bolts of said actuating bolt and nut sets, said axle bearing sets each comprising a bearing block and at least one axle bearing respectively mounted in said bearing block.

14. The front-opening unified pod closing/opening control structure as claimed in claim 13 wherein said axle bearing sets each further comprise a spacer ring mounted in said bearing block and retained between each two of said at least one axle bearing.

15. The front-opening unified pod closing/opening control structure as claimed in claim 1 wherein the axially extended center hole of the gasket member of each of said worm gear sets is a rectangular hole, and the actuating portion of the actuating bolt of each of said actuating bolt and nut sets has a rectangular cross section fitting the rectangular center hole of the corresponding gasket member.

16. The front-opening unified pod closing/opening control structure as claimed in claim 1 wherein the locating plate of each of said worm gear sets is fixedly fastened to the transverse groove of the corresponding gasket member by screws.

17. The front-opening unified pod closing/opening control structure as claimed in claim 1 wherein the hook of the actuating bolt of each of said actuating bolt and nut sets has a T-shaped profile.

18. The front-opening unified pod closing/opening control structure as claimed in claim 1 further comprising sensor means adapted to detect and control the operation of said motor.

19. The front-opening unified pod closing/opening control structure as claimed in claim 18 wherein said sensor means start to detect the operation of said motor when the locating plates of said worm gear sets touch said first stop pins.

20. The front-opening unified pod closing/opening control structure as claimed in claim 1 wherein the worm gear of each of said worm gear sets is respectively molded from plastics.

* * * * *